US010259905B2

(12) United States Patent
Reynolds et al.

(10) Patent No.: US 10,259,905 B2
(45) Date of Patent: Apr. 16, 2019

(54) BROADLY ABSORBING ELECTROCHROMIC POLYMERS

(71) Applicant: University of Florida Research Foundation, Incorporated, Gainesville, FL (US)

(72) Inventors: John Robert Reynolds, Dunwoody, GA (US); Michael R. Craig, Summerville, SC (US); Aubrey Lynn Dyer, Hapeville, GA (US); Justin Adam Kerszulis, Foster City, CA (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 227 days.

(21) Appl. No.: 15/310,010

(22) PCT Filed: May 22, 2015

(86) PCT No.: PCT/US2015/032224
§ 371 (c)(1),
(2) Date: Nov. 9, 2016

(87) PCT Pub. No.: WO2015/179789
PCT Pub. Date: Nov. 26, 2015

(65) Prior Publication Data
US 2017/0267811 A1 Sep. 21, 2017

Related U.S. Application Data

(60) Provisional application No. 62/002,700, filed on May 23, 2014.

(51) Int. Cl.
*C08G 61/12* (2006.01)
*C08L 41/00* (2006.01)
(Continued)

(52) U.S. Cl.
CPC ............ *C08G 61/126* (2013.01); *C09K 9/02* (2013.01); *G02F 1/15* (2013.01); *H01G 11/56* (2013.01);
(Continued)

(58) Field of Classification Search
CPC ............ C08G 61/126; C08G 2261/54; C08G 2261/124; C08G 2261/312;
(Continued)

(56) References Cited

U.S. PATENT DOCUMENTS 8,604,158 B2 * 12/2013 Beaujuge ............ C08G 61/123
528/377
2013/0023621 A1 1/2013 Seshadri et al.

FOREIGN PATENT DOCUMENTS

IN 2840 MU 2010 A 2/2014
JP 2012-004206 1/2012
(Continued)

OTHER PUBLICATIONS

Justin Adam Kerszulis, Reading the Rainbow: Tailoring the Properties of Electrochromic Polymers, In Partial Fulfillment of the Requirements for the Degree Doctor of Philosophy in the School of Chemistry and Biochemistry, Dec. 2014. (Year: 2014).*
(Continued)

*Primary Examiner* — Bijan Ahvazi
(74) *Attorney, Agent, or Firm* — Alston & Bird LLP

(57) ABSTRACT

Copolymers including dioxythiophene repeating units and no acceptor units allow the formation of electrochromic polymers (ECPs) with vivid neutral state colors and very colorless oxidized states that can be switched rapidly. The dioxythiophene repeating units can included in sequences where all of one type of dioxythiophene is included exclusively as isolated dyads or triads within the copolymer, or the copolymer can be an alternating copolymer with pro-
(Continued)

pylenedioxythiophene units. Other non-acceptor units can be included in the copolymers. The copolymers are rendered organic solvent soluble by alkyl substituents on repeating units. The inclusion of sterically encumbered acyclic dioxythiophene (AcDOT) units promotes red color while unsubstituted ethylenedioxythiophene (EDOT) units promote blue colors, and their respective content can be manipulated to achieve a desired neutral state color. Soluble copolymers comprising at least 50% EDOT repeating units can be used in supercapacitor applications.

10 Claims, 11 Drawing Sheets

(51) Int. Cl.
| | |
|---|---|
| C08F 28/06 | (2006.01) |
| B82Y 30/00 | (2011.01) |
| H01G 11/56 | (2013.01) |
| H01L 51/00 | (2006.01) |
| C09K 9/02 | (2006.01) |
| G02F 1/15 | (2019.01) |
| H01G 11/48 | (2013.01) |

(52) U.S. Cl.
CPC .... *H01L 51/0037* (2013.01); *C08G 2261/124* (2013.01); *C08G 2261/1424* (2013.01); *C08G 2261/312* (2013.01); *C08G 2261/3223* (2013.01); *C08G 2261/54* (2013.01); *C09K 2211/145* (2013.01); *C09K 2211/1425* (2013.01); *C09K 2211/1458* (2013.01); *G02F 2001/1515* (2013.01); *H01G 11/48* (2013.01); *Y02E 60/13* (2013.01)

(58) Field of Classification Search
CPC .... C08G 2261/1424; C08G 2261/3223; C09K 9/02; C09K 2211/145; C09K 2211/1425; C09K 2211/1458; H01G 11/56; G02F 1/15; G02F 2001/1515
See application file for complete search history.

(56) References Cited

FOREIGN PATENT DOCUMENTS

| KR | 10-2010-0130909 A | 12/2010 |
|---|---|---|
| WO | WO 2014/205024 | 12/2014 |

OTHER PUBLICATIONS

Kerszulis, J.A. et al., "Follow the Yellow Brick Road: Structural Optimization of Vibrant Yellow-to-Transmissive Electrochromic Conjugated Polymers," *Macromolecules*, 2014, pp. 5462-5469, vol. 47, No. 16.

Nishimura, K. et al., "Photoelectric converter containing tris(ethylenedioxythiophenyl) amine polymer or similar aromatic polymer in hole-transporting layer and solar cell equipped therewith," *Chemical Abstracts Service*, 2012, Database CA [Online] retrieved from STN, Database accession No. 2012:21589, abstract.

Song, I.Y. et al., "Well-Defined All-Conducting Block Copolymer Bilayer Hybrid Nanostructure: Selective Positioning of Lithium Ions and Efficient Charge Collection," *ACS Nano*, 2014, pp. 6893-6901, vol. 8, No. 7.

Anshu, K., et al., "Single step reductive polymerization of functional 3,4-propylenedioxythiophenes via direct C—H arylation catalyzed by palladium acetate," Polymer Chemistry, 1(3):286-288 (2010).

Beaujuge, P.M., et al., "Structure-performance correlations in spray-processable green dioxythiophene-benzothiodoazole donor-acceptor polymer electrochromes," Chemistry of Materials, 24(2):255-268 (2012).

Dyer, A.L., et al., "Completing the Color Palette with Spray-Processable Polymer Electrochromics," ACS Applied Materials & Interfaces, 3:1787-1795 (2011).

Dyer, A.L., et al., "Orange and red to transmissive electrochromic polymers based on electron-rich dioxythiophenes," Macromolecules, 43(10):4460-4467 (2010).

İçli-Özkut, M., et al., "A neutral state yellow to navy polymer electrochrome with pyrene scaffold," Organic Electronics 12(9):1505-1511 (2011).

Kerszulis, J.A., et al., "Tuning the painter's palette: subtle steric effects on spectra and colour in conjugated electrochromic polymers," Journal of Materials Chemistry C., 3(13):3211-3218 (2015).

Öesterholm, A.M., et al., "Four shades of brown: tuning of electrochromic polymer blends toward high-contrast eyewear," ACS Applied Materials & Interfaces, 7(3):1413-1421 (2015).

Shen, D.E., et al., "Novel Bis-arylPheDOT Synthons for Electrochromic Polymers," Journal of Macromolecular Science, Part A—Pure and Applied Chemistry, 47(1):6-11 (2009).

Wang, Y., et al., "Tuning the properties of alternating copolymers from fluorobenzene and thiophene derivatives," Polymer Preprints, 48(2):127 (2007).

PCT International Search Report and Written Opinion of the International Searching Authority for application PCT/US2015/032224 dated Aug. 25, 2015.

Supplemental European Search Report for application EP 15796458.6 dated May 8, 2018.

* cited by examiner

Neut: 41,9,-60
Ox: 92,-3,-2

Neut: 58,-8,-42
Ox: 87,-6,-3

BROADLY ABSORBING ELECTROCHROMIC POLYMERS

CROSS-REFERENCE TO RELATED APPLICATIONS

This application is the U.S. national stage of International patent application no. PCT/US2015/032224, filed May 22, 2015, which claims the benefit of U.S. Provisional Application Ser. No. 62/002,700, filed May 23, 2014, the disclosures of which are hereby incorporated by reference in their entireties, including all figures, tables and drawings.

BACKGROUND OF INVENTION

Electrochromic polymers (ECPs) display a broad array of colors that can switch from the colored states to highly transmissive states. When appropriately substituted, these ECPs allow processing via spin coating, spray coating, blade coating, slot-die coating, and inkjet printing. These polymers may attain highly transmissive states with high electrochromic contrast that can be rapidly (sub-second) switched over a large number of cycles (>10000); which allow ECPs to be incorporated into display and window type electrochromic devices (ECDs) that are commercially viable.

Structural features that have been used to generate desirable visible absorption and color of the neutral state in ECPs include polymers that exploit donor-acceptor (D-A) effects, vinylene and azomethine linkers, interchange of atoms of the constituent heterocycles or that reside on β positions, variations of the repeating unit structure by the comonomer feed ratios, modification of pendant groups, and incorporation of metal-ligand interactions of metallo-supramolecular polymers. The D-A method has proven especially useful, as the donor moiety positions the HOMO while the acceptor positions the LUMO, retains the low oxidation potentials required for long term redox switching.

The transmissive oxidized states of D-A ECPs show tailing of charge carrier absorption in the near infrared into the visible spectrum, resulting in residual visible absorption that induces a blue tint to a film of the polymer. This tailing effect is evident in poly(3,4-ethylenedioxythiophene) (PEDOT), but is minimal in poly(3,4-propylenedioxythiophene) (ProDOT) ECPs that have long and bulky substituents. As exemplified by the use of an acyclic dioxythiophene (AcDOT) to develop orange and red-colored ECPs, steric control alone is capable of tuning color. It is therefore desirable to achieve ECPs of a desired color that retain the outstanding electrochromic switching to highly transmissive states that is readily achieved due to the highly electron rich nature of alkylene dioxythiophenes.

BRIEF SUMMARY

Embodiment of the invention are directed to electrochromic polymers (ECPs) that are copolymers free of electron acceptor repeating units that provide higher intensity neutral state colors, are more transmissive and colorless in their oxidized states than the color equivalent donor-acceptor electrochromic polymers, and are soluble in at least one organic solvent. In an embodiment of the invention, the copolymers can be used as soluble charge storage polymers where by limiting steric interactions in the soluble copolymers low oxidation potentials are achieved that allow high stability to repeated charging and discharging. The copolymers can have two different repeating unit structures along the backbone or can have three or more different repeating unit structures. Herein the term copolymer herein is inclusive of terpolymers and tetrapolymers. The copolymers can be a portion of a block copolymer or a non-block copolymer. The copolymer consists of repeating units with at least one dioxythiophene repeating unit residing exclusively as isolated dyads or the copolymer is an alternating copolymer of repeating unit comprising a propylenedioxythiophene (ProDOT) and an acyclic dioxythiophene (AcDOT), a phenylene dioxythiophene (PheDOT), or an ethylene dioxythiophene (EDOT) or an alternating copolymer of repeating unit comprising a phenylene dioxythiophene (PheDOT) and an acyclic dioxythiophene (AcDOT). Optionally, the copolymers can include at least one additional non-acceptor repeating unit selected from arylenes, thiophenes, furans, selenophenes, pyrroles, N-substituted pyrroles, acyclic dioxyfurans, acyclic dioxypyrroles, propylenedioxyfurans, propylenedioxypyrroles, phenylene dioxypyrroles, phenylene dioxyselenophenes, N-substituted propylenedioxypyrroles, ethylenedioxyfurans, acyclic dioxyselenophenes, ethylenedioxyselenophenes, propylenedioxyselenophenes, ethylenedioxypyrroles, and N-substituted ethylenedioxypyrroles.

Solubility is imparted by an alkyl comprising substituent on repeating units, where the substituent can be a portion of an alkoxy group on the AcDOT, the ProDOT, or on any carbon or nitrogen that is not on the 2 or 5 position of a five-membered heterocycle along the backbone of the copolymer. The arylene group can be a phenylene group, naphthalene group or any other arylene where conjugation can be maintained through the π-system of the copolymer. The alkyl groups as defined for purposes of the invention, can be $C_3$ to $C_{20}$ alkyls, and can be linear, branched, cyclic, alkyl substituted cyclic, or cyclic substituted alkyl. The alkyl group can be interrupted by one or more oxygen.

The ECP can have ethylenedioxythiophene ($EDOT_2$) dyads or ethylenedioxythiophene ($EDOT_3$) triads within the backbone, which favors a "relaxation" of the backbone with conjugation of the π system extending over a plurality of repeating units. Isolated EDOT repeating units are also favorable for torsional "relaxation." The ECP can have acyclic dioxythiophene ($AcDOT_2$) dyads or propylenedioxythiophene ($ProDOT_2$) dyads within the backbone. An AcDOT repeating unit or an $ACDOT_2$ dyad in the backbone presents a "strain" which is steric interactions that promote orthogonality of the repeating units promoting a π system that is not extended over a plurality of repeating units. The color consequence of these units allows tuning of the color of the copolymers' neutral states.

Among the ECPs, according to embodiments of the invention, are the copolymers: $AcDOT_2$-$EDOT_2$; AcDOT-ProDOT; $AcDOT_2$-ProDOT; $AcDOT_2$-$EDOT_2$; $ProDOT_2$-EDOT; ProDOT-EDOT; $ProDOT_2$-$EDOT_2$; or ProDOT-$EDOT_2$, where the alkyl groups reside at both alkoxy groups of the AcDOT units or as a portion of the pair of alkoxymethyl substituents on the propylene dioxy portion of the ProDOT repeating units. Exemplary alkyl groups are ethylhexyl (branched $C_8$) and octadecyl (linear $C_{18}$).

The ECPs can be used as one or more active layers of an electrochromic device, such as display and window devices. When the ECP includes at least 50% unsubstituted EDOT repeating units, solution deposited films of the ECP can be used as the charge storing material in supercapacitors.

DETAILED DISCLOSURE

Figure 1:
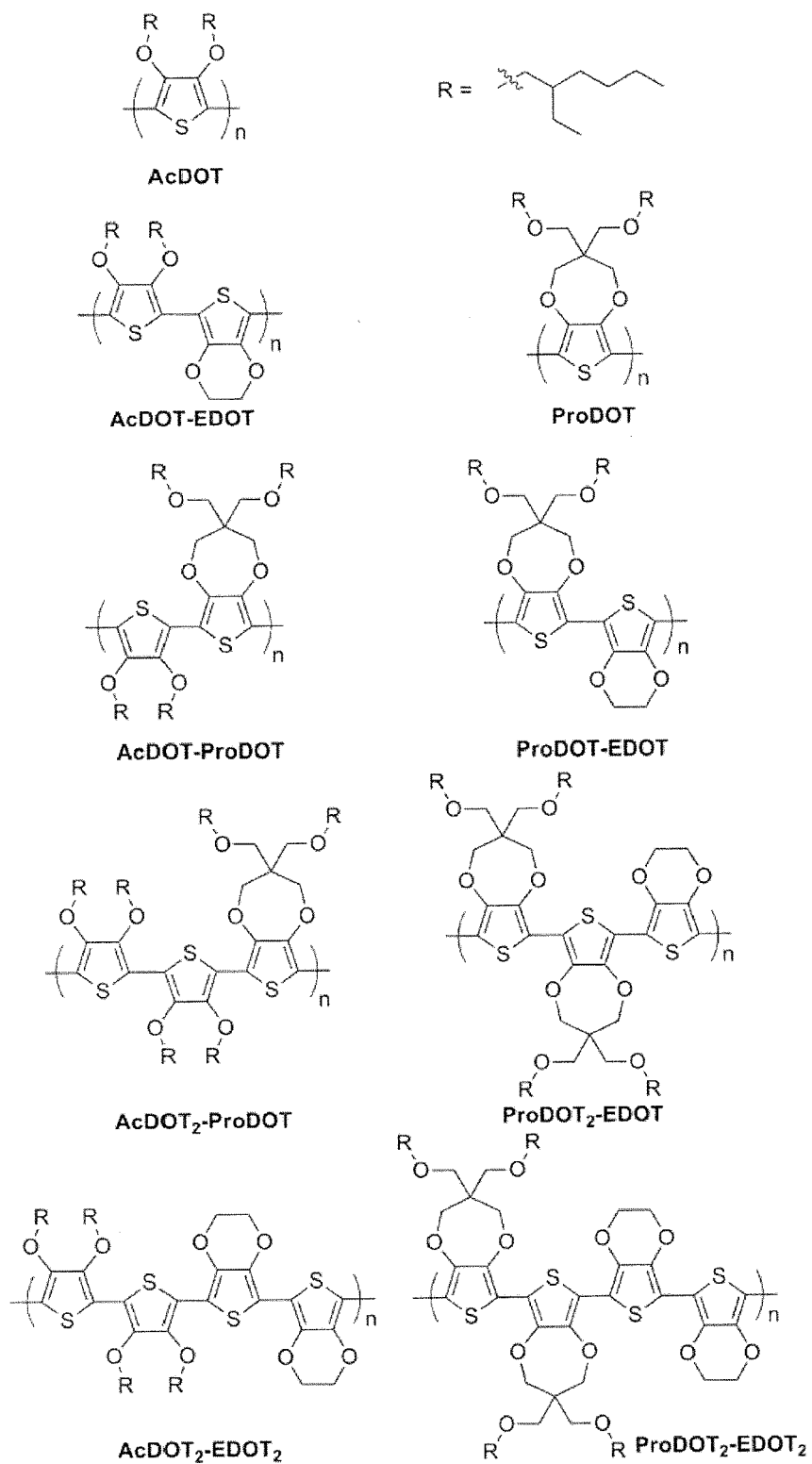
FIG. 1 shows the structure of electrochromic polymers (ECPs) according to an embodiment of the invention.

Embodiments of the invention are directed to electrochromic polymers (ECPs) that are copolymers that contain only electron donor repeating units and, optionally, aryl repeating units, where at least one of the repeating units is 3,4-dioxythiophenes that displays a variety of colors, including, but not limited to, black, brown, deep purple, magenta, pink, blue and cyan in the reduced states. No electron acceptor repeating units are within the polymer backbone. The ECPs have 3,4-dioxythiophene repeating units that alternate or are randomly situated within a polymer backbone with other 3,4-substituted thiophene repeating units and, optionally, other aryl ring repeating units, fused ring repeating units, or other donor heterocycle repeating units, including pyrroles and furans. These all-donor polymers exhibit a high electrochromic contrast, switching from a vibrant colored state to a highly transmissive state. Copolymers, according to an embodiment of the invention, have at least one dioxythiophene repeating unit that resides exclusively within the backbone as isolated dyads, triads, or both dyads and triads, or the copolymer is an alternating copolymer of a repeating unit that are propylenedioxythiophene (ProDOT) and an acyclic dioxythiophene (AcDOT), a phenylene dioxythiophene (PheDOT) or an ethylene dioxythiophene (EDOT). For example the copolymer can be ProDOT-alt-AcDOT, ProDOT-alt-EDOT, or ProDOT-PheDOT. The copolymer can be AcDOT-alt-PheDOT. FIG. 1 shows some exemplary ECPs including prior art homopolymers and copolymers according to embodiments of the invention, where the alkyloxy substituent on the AcDOT and ProDOT are 2-ethylhexanoxy groups. Additionally, an exemplary ProDOT-EDOT$_2$ displays Mn=55 kDa, PDI=1.80, Yield=92%, Absorbance Onset=1.71 eV, and $\lambda_{max}$=613 nm.

TABLE 1

All polymer molecular weight, yield, and solid state spectroscopy data.

| Polymer | Molecular Weight (Mn, PDI, solvent (kDa)). | Yield (%) | Absorption Onset (eV) | $\lambda_{max}$ (nm) |
|---|---|---|---|---|
| ProDOT | 12.3, 1.77, THF | 40 | 1.97 | 555, 606 |
| ProDOT$_2$-EDOT | NA | 82 | 1.81 | 590 |
| ProDOT-EDOT | NA | 24 | 1.75 | 597 |
| ProDOT$_2$-EDOT$_2$ | NA | 70 | 1.74 | 606 |
| AcDOT | 279.7, 2.08, THF | 62 | 2.10 | 490 |
| AcDOT$_2$-ProDOT | 176.0, 2.20, THF | 82 | 2.01 | 536, 579 |
| AcDOT-ProDOT | 51.8, 2.37, THF | 97 | 2.00 | 541, 587 |
| AcDOT-EDOT | 30.9, 1.21, THF | 75 | 1.84 | 553 |
| AcDOT$_2$-EDOT$_2$ | NA | 60 | 1.81 | 557 |

FIG. 2 shows visible spectra for the copolymers, according to embodiments of the invention (and prior art ProDOT, and AcDOT) that represent two groups, one group with blue hues consisting of ProDOT-EDOT, ProDOT$_2$-EDOT, and ProDOT$_2$-EDOT$_2$ and a second group with magenta hues consisting of AcDOT-ProDOT, AcDOT$_2$-ProDOT, and AcDOT-EDOT. Additionally AcDOT$_2$-EDOT$_2$, which has a purple hue, is included. These groups of blue and magenta ECPs display effects of subtle "relaxation" and torsional "strain" within the copolymer backbone on the copolymers' spectra.

The copolymers, according to an embodiment of the invention, undergo a "break in" where the copolymer films are electrochemically conditioned upon 25 cycles via cyclic voltammetry (CV) where the current stabilizes leading to reproducible identical cycles thereafter. In a typical "break in" the first and second cycle shows a significant current decrease, after which the current decreases slightly between successive cycles until no discernable difference is observable by the 25$^{th}$ cycle. All of the copolymers and the ProDOT homopolymer oxidize easily where the onsets for the oxidation potentials range from −490 to 206 mV. The AcDOT (ECP-Orange) homopolymers display an oxidation potential of 260 mV, which is consistent with its pendant groups' bulkiness. The "break in" is consistent with a steric relaxation along the conjugated backbone where the conformation between adjacent repeating units allows greater average conjugation lengths. Particularly where the repeating unit is EDOT and is adjacent to repeating units with large solubilizing substituents, drastic changes between the pristine and broken-in film states can occur. Greater steric strain is introduced by AcDOT repeating units, and greater AcDOT content permits minimal change between the pristine and "broken in" states. Differential pulse voltammetry indicates that by increasing steric strain of the copolymer, the oxidation potential onset is raised relative to copolymers, while repeating units that permit relaxation to longer average conjugation lengths lower the onset.

Figure 2A:
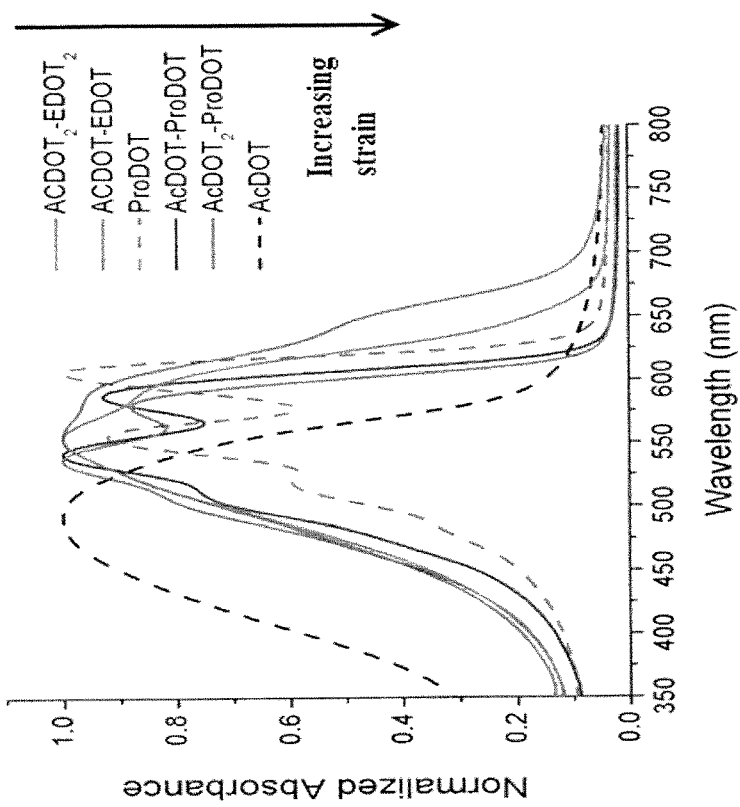
FIG. 2 shows absorbance spectra of selected electrochromic polymers (ECPs) according to an embodiment of the invention, a prior art alternating copolymer and prior art homopolymers for comparison.
Figure 2B:
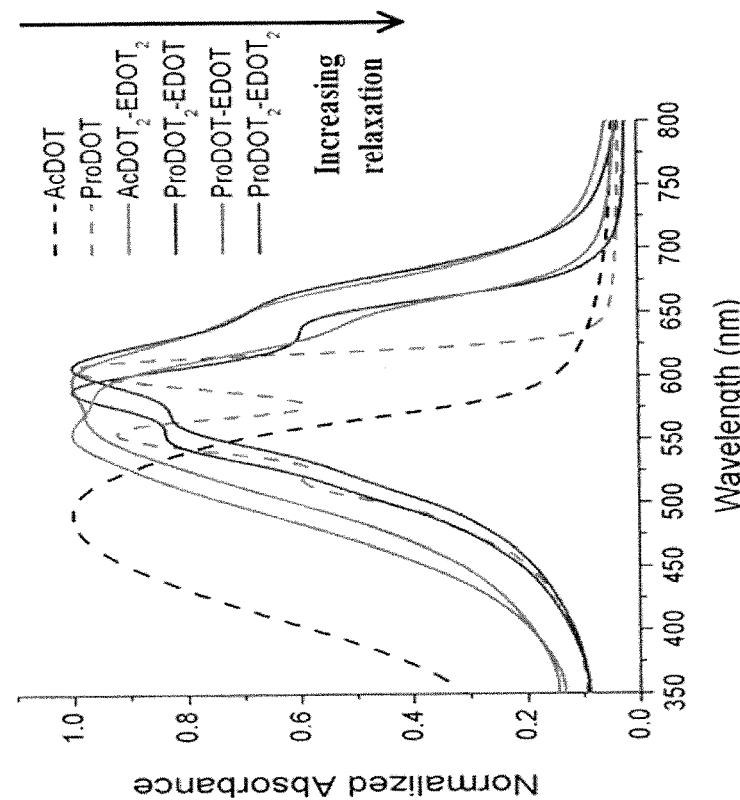

In concert with the changes observed in CV behavior during "break in", the copolymer film's spectra redshifts and an increase in optical density is induced upon "relaxation" to greater conjugation lengths, while such changes in the spectra are reduced with increasing content of repeating units that induce steric hindrance to planarity between repeating units. For example, for the copolymer $AcDOT_2$-ProDOT, there is no spectral difference between the pristine and "broken in" state, which can be correlated to a minimal change during CV. As indicated in FIG. 2a, as the copolymer's EDOT content increases, one observes an increased long wavelength absorption relative to the ProDOT and AcDOT homopolymers. The copolymers possess considerably lower band gaps relative to ProDOT, and due to greater absorption of long wavelength light, the copolymer films appear periwinkle-blue to the eye. The red-shifted absorption onset of around 700-750 nm allow these polymers to be used as organic soluble analogues of PEDOT. Conversely, as indicated in FIG. 2b, increasing the steric hindering AcDOT repeating unit content, shorter wavelength absorption is induced relative to ProDOT. As these copolymers absorb more of the high energy portion of the visible spectrum, the amount of blue light reflected decreases to render these copolymer films "reddened" and result in rather vivid magenta and pink neutral state colors.

The comonomers' composition has an overall effect on vibronic coupling observed in the spectra. Relative to the ProDOT homopolymer, which exhibits a high degree of order, characterized by multiple defined maxima in the spectrum, inclusion of more sterically bulky AcDOT repeating units, as indicated by the spectra of AcDOT-ProDOT and $AcDOT_2$-ProDOT, promotes little decrease in the degree of vibronic coupling, evidenced by little decrease in the definition of the multiple peaks. In contrast, by increasing the EDOT repeating unit content, there is a decrease in the degree of vibronic coupling observed as the low steric hindrance imposed by the EDOT units, which allows the propylene bridge on neighboring ProDOT repeating units to experience greater conformational freedom and disorder to the polymer backbone, reducing the degree of vibronic coupling and broadening the spectra relative to that of the ProDOT homopolymer.

Figures 3A, 3B:
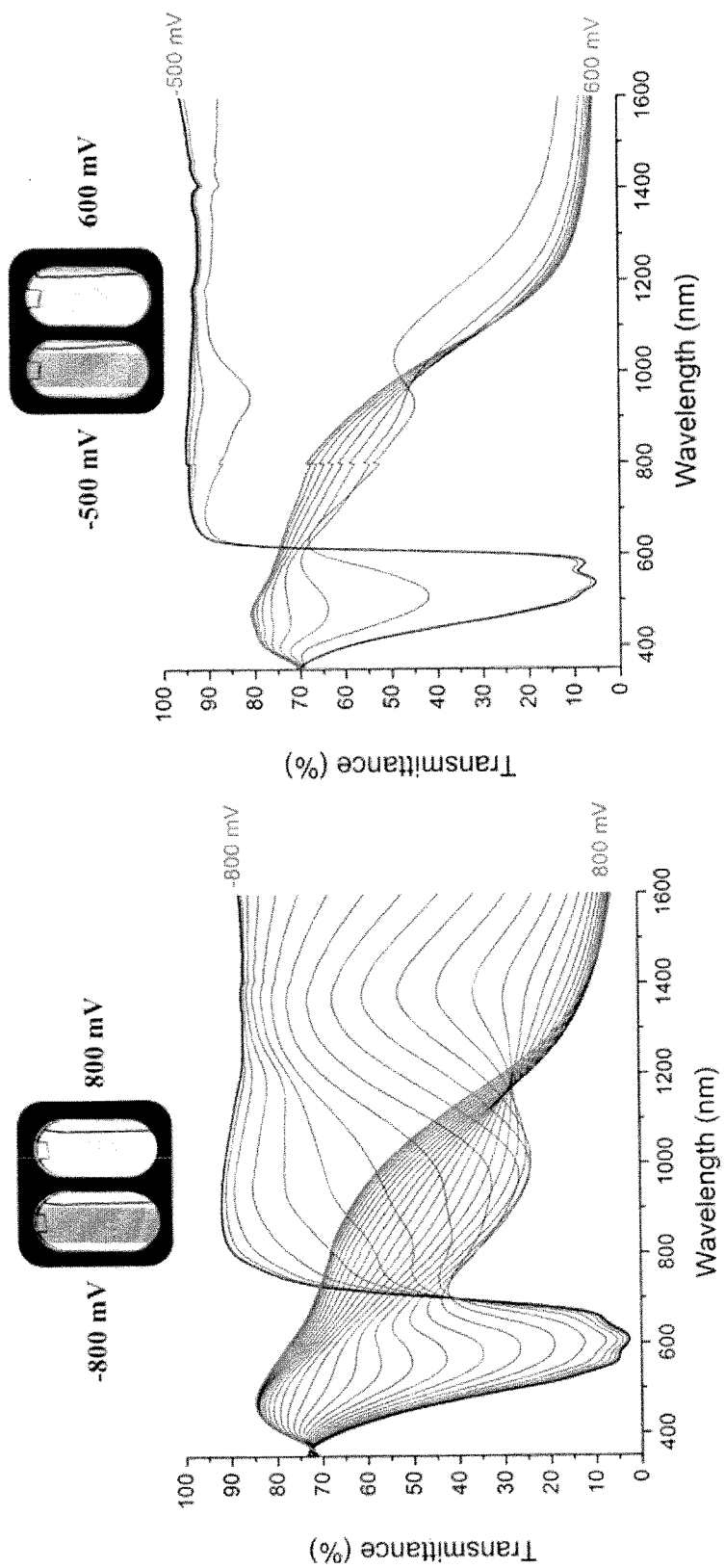
FIG. 3a and FIG. 3b show transmittance spectra over the range of potentials that converts the neutral state colored copolymer to an oxidized state transmissive copolymer for films sprayed to an optical density of about 1.2 a.u. of ProDOT$_2$-EDOT$_2$ and AcDOT$_2$-ProDOT, respectively, for potential steps of 50 mV with 0.5 M TBAPF$_6$ in PC with a Pt wire as counter electrode and an Ag/Ag$^+$ reference electrode calibrated to Fc/Fc$^+$ with a value of 82 mV, according to an embodiment of the invention.

These conformational effects extend to the spectroelectrochemistry of the copolymers according to embodiments of the invention. Transmittance spectra over a range of potentials for two exemplary copolymers, according to an embodiment of the invention, $ProDOT_2$-$EDOT_2$ and $AcDOT_2$-ProDOT, are shown in FIG. 3. The copolymers have two propylenedioxythiophene repeating units, a dyad, alternating with two ethylenedioxythiophene repeating units, a second dyad, ($ProDOT_2$-$EDOT_2$) and two acyclic dioxythiophene repeating units, a dyad, alternating with one propylenedioxythiophene repeating units ($AcDOT_2$-ProDOT). As is seen in FIG. 3 for these two exemplary copolymers, all copolymers, according to embodiments of the invention, exhibit changes in contrast of more than 60% at $\lambda_{max}$, as is presented in Table 2, below. $ProDOT_2$-$EDOT_2$ and $AcDOT_2$-ProDOT exhibit the highest contrast values, 75 and 73 $\Delta$ % T at $\lambda_{max}$, respectively, because of the least residual visible absorption in the fully oxidized transmissive state, even for thicker films. The copolymers with EDOT repeating units have a broadened potential range over which the copolymer switches with subtle changes over the duration of oxidation, as illustrated in FIG. 3a, while copolymers incorporating AcDOT repeating units display a narrowed potential window with gross changes over each potential step. This difference in behavior can be attributed to delocalized conformational defects due to the greater orthogonality of adjacent repeating units (less planarity) induced by the steric hindrance to planarity imposed by the AcDOT repeating units of the AcDOT-ProDOT and $AcDOT_2$-ProDOT copolymers, there is significant resistance to planarization on initial oxidation, but upon increasing oxidation potential, localized planarization promotes rapid propagation of planarization between neighboring repeat units.

TABLE 2

L*a*b* color coordinates for all polymers in the neutral and transmissive oxidized states and total change in contrast upon switching between the extremes

| Strained Polymers | $\Delta$% T (at $\lambda_{max}$) | Neutral State L*, a*, b* | Oxidized State L*, a*, b* | Strained Polymers | $\Delta$% T (at $\lambda_{max}$) | Neutral State L*, a*, b* | Oxidized State L*, a*, b* |
|---|---|---|---|---|---|---|---|
| AcDOT | 48 | 72, 42, 53 | 81, −2, −7 | $AcDOT_2$-$EDOT_2$ | 70 | 38, 38, −44 | 91, −2, −4 |
| ProDOT | 71 | 50, 51, −37 | 88, −1, −2 | AcDOT-EDOT | 63 | 49, 41, −35 | 88, −3, −4 |
| $AcDOT_2$-$EDOT_2$ | 70 | 38, 38, −44 | 91, −2, −4 | ProDOT | 71 | 50, 51, −37 | 88, −1, −2 |
| $ProDOT_2$-EDOT | 71 | 33, 32, −63 | 90, −2, −3 | AcDOT-ProDOT | 72 | 47, 70, −36 | 91, −2, −3 |
| ProDOT-EDOT | 68 | 40, 16, −43 | 85, −4, −5 | $AcDOT_2$-ProDOT | 73 | 56, 59, −16 | 91, −2, −1 |
| $ProDOT_2$-$EDOT_2$ | 75 | 37, 12, −63 | 92, −3, −3 | AcDOT | 48 | 72, 42, 53 | 81, −2, −7 |

The switching kinetics for all copolymers, according to embodiments of the invention, which can be probed by chronoabsorptometry, is rapid from their full neutral color to their oxidized transmissive state, where repeated switching in 1 second intervals show minimal loss in contrast. Contrast loss observed at ½ and ¼ second cycles is consistent with diffusion limiting processes of electrolyte migration within the copolymer film, as after cycling at high switching speeds; the copolymers are all capable of regaining high levels of contrast with no apparent negative effects such as delaminating, or blistering.

Figure 4:
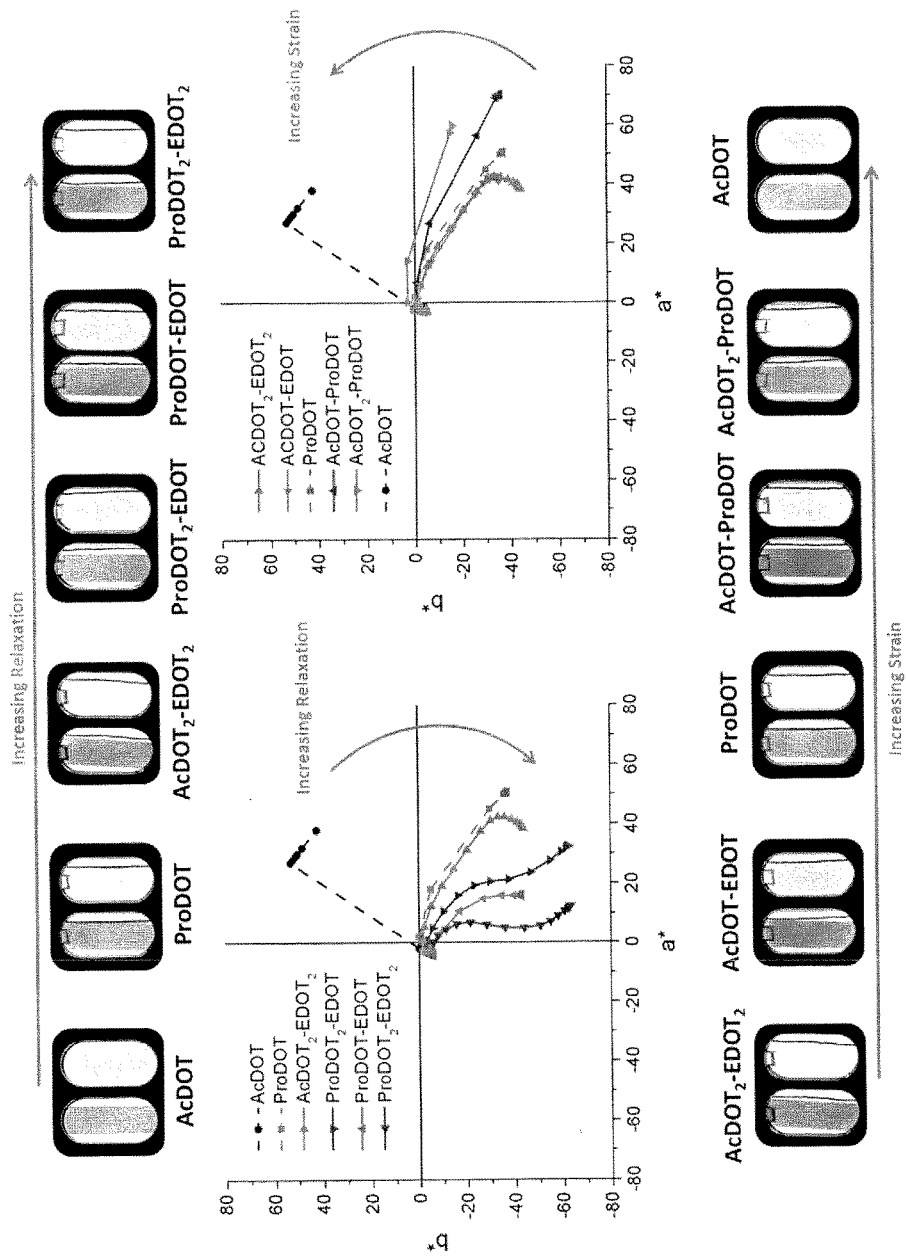
FIG. 4 shows colorimetry plots for blue and magenta hue ECPs, according to embodiments of the invention, where all films sprayed to about 1.0 a.u., where the direction of the arrow indicates increasing planarity of repeating units of the n-conjugated backbone (relaxation), left and above, and increased orthogonality of repeating units of the π-conjugated backbone (strain), right and below.

The colorimetric properties of each polymer, as a*b* color tracks, are presented in FIG. 4, which includes photographs of the polymer films in the neutral and oxidized state, with the color values of each polymer in the neutral and fully oxidized states given in Table 2, above. The color trend for the blue hued ECPs with increasing "relaxation," from high degrees of orthogonality between repeating units to high degrees of conjugation of π-bonds between repeating units, is a progression from orange through purple to blue a*b* values as follows: AcDOT (42, 53)→ProDOT (51, −37)→AcDOT$_2$-EDOT$_2$ (38, −44)→ProDOT$_2$-EDOT (32, −63)→ProDOT-EDOT (16, −43) ProDOT$_2$-EDOT$_2$ (12, −63)→ProDOT-EDOT$_2$ (10, −56). The long wavelength absorption transitions, induced through relaxation, occur with increased EDOT unit content of the copolymers, with color values in the neutral state progressing to lower a* values, indicating less purple and more blue hue due to the progressive transmission of more blue and less red light. The absorption of the copolymer ProDOT-EDOT$_2$ closely matches that of PEDOT, with L*, a*, b* values of 35, 10, −54. The color trend for the magenta hued ECPs with increasing steric strain, which induces orthogonality at the cost of conjugation length, is a progression from purple through pink to orange a*b* values as follows: AcDOT$_2$-EDOT$_2$ (38, −44)→AcDOT-EDOT (41, −35)→ProDOT (51, −37)→AcDOT-ProDOT (70, −36)→AcDOT$_2$-ProDOT (59, −16)→AcDOT (42, 53). This increased steric strain coincides with the increase of the AcDOT content with a progression to higher b* values indicating less purple and more red hue due to the progressive transmission of more red and less blue light. The AcDOT$_2$-ProDOT copolymer nearly matches the standard magenta of L*, a*, b* of 52, 50, −15 after "break in" and is capable of providing more accurate color mixing in the cyan-magenta-yellow (CMY) subtractive regime using soluble polymers.

Figures 5A, 5B:
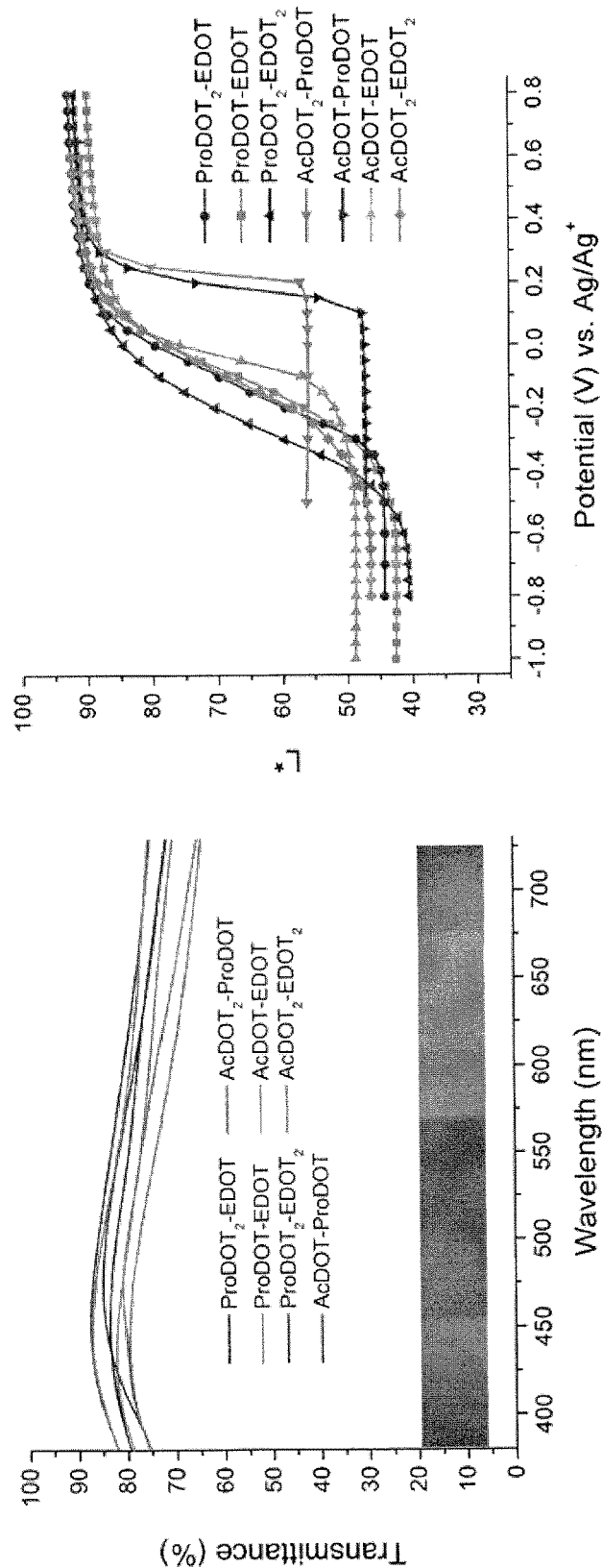
FIG. 5a shows a plot of % transmittance over the visible spectrum for ECPs according to an embodiment of the invention, and a prior art AcDOT-EDOT copolymer in the fully oxidized state.
FIG. 5b shows a plot of the lightness values (L*) for all ECPs as a function of voltage for films sprayed to about 1.0 a.u.

The minimal hue and saturation of color in the oxidized form for all of these copolymers arises from minimal residual absorption in the visible spectrum because of their electron rich, all-donating character, as shown by FIG. 5a. The lightness values (L*) are a function of voltage during switching of the copolymers, as shown in FIG. 5b. Upon oxidation all lightness values are high, 85 or greater.

Figure 6A:
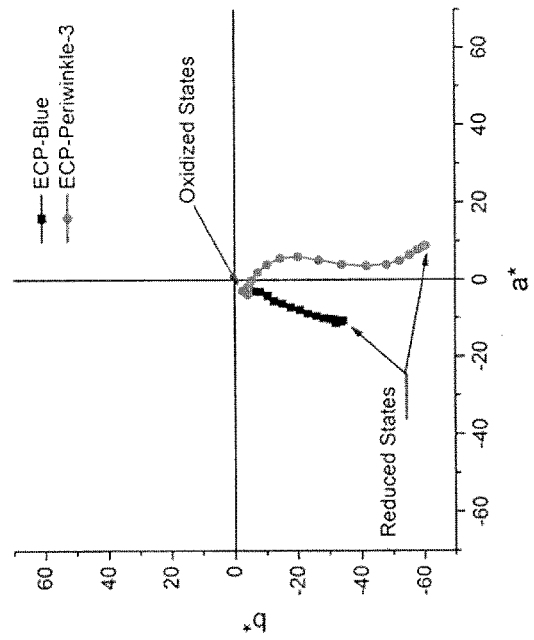
FIG. 6 shows the structure, color values, % transmittance and colorimetry plots for ProDOT$_2$-EDOT$_2$, according to an embodiment of the invention, which is free of an acceptor repeating unit and the inferior color intensity and transmissive oxidized state of a similarly colored ProDOT-BTD alternating copolymer having an acceptor repeating unit.
Figure 6B:
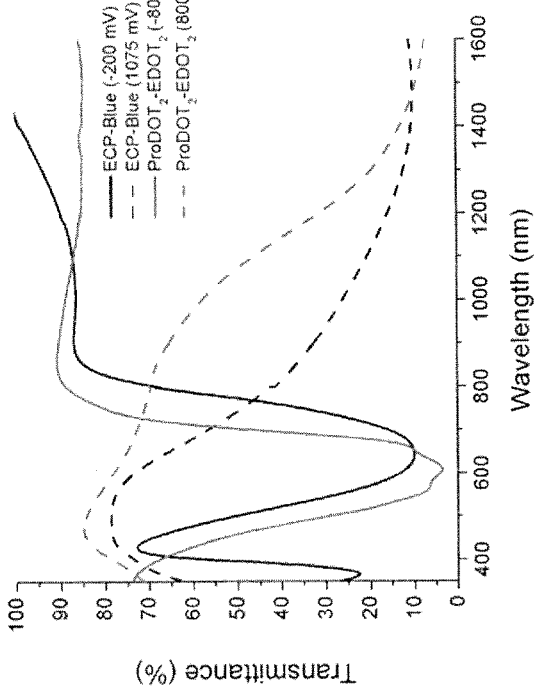

Through incorporation of EDOT repeating units, a subtle tuning of the all donor copolymers can yield materials with low band gaps, such as the (ProDOT$_2$-EDOT$_2$)$_n$ copolymer, where the blue neutral states have color values that are comparable to those of blue-to-transmissive ECP designed with donor-acceptor (D-A) units. A comparison between the neutral states for the ProDOT$_2$-EDOT$_2$ copolymer, according to an embodiment of the invention, and ECP-Blue, a ProDOT-BTD alternating copolymer, where BTD is benzothiadiazole, is illustrated in FIG. 6. FIG. 6a gives the transmittance spectra of ECP-Blue, which displays dual band absorptions where the shorter wavelength absorption is for a π to π transition and the longer wavelength absorption is due to the donor-acceptor charge transfer interactions. The ProDOT$_2$-EDOT$_2$ displays an absorption that was attained with an onset at shorter wavelengths (1.74 eV), remaining at the edge of the visible spectrum. Through the D-A approach, a lower onset was achieved (1.53 eV) with a window of transmission at 431 nm between the two bands. The ProDOT$_2$-EDOT$_2$ copolymer allows a majority of blue light, and a minimal amount of red light, to be transmitted and a saturated blue color is observed. The ECP-Blue has a more redshifted onset from the CT absorption, which allows more green than red light to transmit, however, the higher energy π to π* absorbs more blue and violet light and results in a less saturated sky-blue color. Though they have similar numerical color values, ProDOT$_2$-EDOT$_2$ appears more saturated because more blue light is transmitted.

Figure 6C:
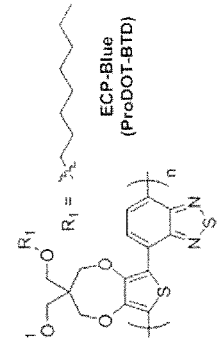
Figure 6C:
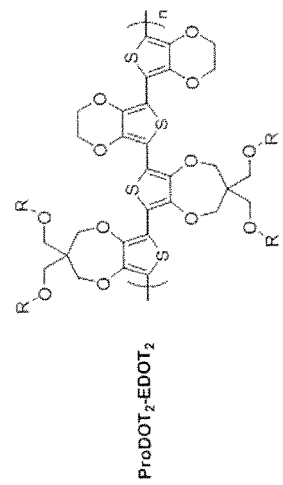

The electron rich character of all the donor polymers allows full bleaching, being oxidized to where a*b* color values approach zero and L* is high at potentials that are lower than those exhibited by ECP-Blue. In the oxidized transmissive states the π-electron donating character of the oxygens residing on the β-positions of thiophene of the all donor copolymer (ProDOT$_2$-EDOT$_2$) imparts stabilization to the oxidized form, red-shifting the overall absorption with a diminished absorption between 700 and 1,000 nm relative to the donor-acceptor system (ECP-Blue). In FIG. 6a one can see a significant absorption tailing into the long wavelength portion of the visible (600-720 nm) with a peak in the NIR at ~1460 nm for ECP-Blue's transmissive state with a blue tint upon oxidation, as can be seen in FIG. 6c, while ProDOT$_2$-EDOT$_2$ exhibits minimal tailing in the same portion and is nearly colorless in the oxidized state. Hence, while lower gaps can be attained by donor-acceptor copolymers, the lower gap is attained with a decrease in the electrochromic contrast relative to an all donor copolymer because of the tailing absorption of incorporated electron deficient acceptors. Hence, it was discovered that by employing copolymers free of acceptor repeating units, particularly where repeating units with minimal steric requirements are included, copolymers with comparably low gaps are available that can be employed for color applications with high electrochromic contrast gaps using known dioxythiophene repeating units.

The copolymers, according to embodiments of the invention, can be prepared by any method, including: Grignard metathesis (GRIM); Stille coupling; Suzuki coupling; or oxidative polymerization (OxP). A direct arylation copolymer synthesis, using the method disclosed in International Patent Application Publication No. WO/2014/205024, entitled "Method for Preparing Dioxyheterocycle-Based Electrochromic Polymers," and incorporated herein by reference, was employed for the exemplary polymers disclosed herein. Advantageously, this method affords resulting polymers that display a narrower molecular weight distribution than does the equivalent polymer prepared at lower temperatures and distributions that are equivalent or lower than the equivalent polymer prepared by the alternative synthetic routes, above. The direct arylation method provides a quality copolymer with few impurities, particularly metallic impurities, and with few purification steps. The copolymerization of a ProDOT and EDOT to form the alternation copolymer (ProDOT-EDOT), also called ECP-Periwinkle-1, is shown below:

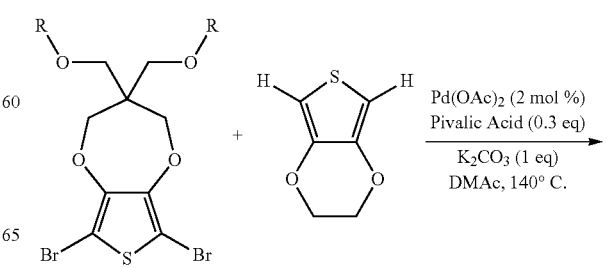

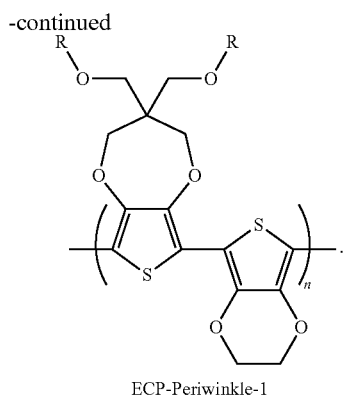

ECP-Periwinkle-1

Figure 7:
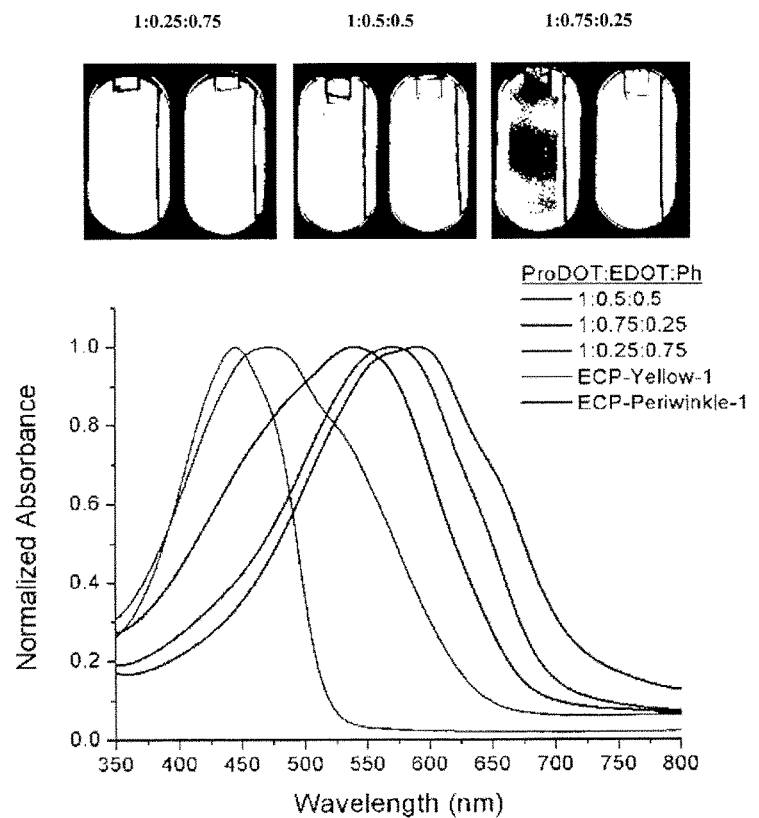
FIG. 7 shows the absorbance spectra for ECPs, according to an embodiment of the invention, with included phenylene repeating units with a prior art ProDOT-phenylene alternating copolymer EPC-Yellow-1 and the alternation copolymer ProDOT-EDOT (ECP-Periwinkle-1) according to an embodiment of the invention.
Figure 7:
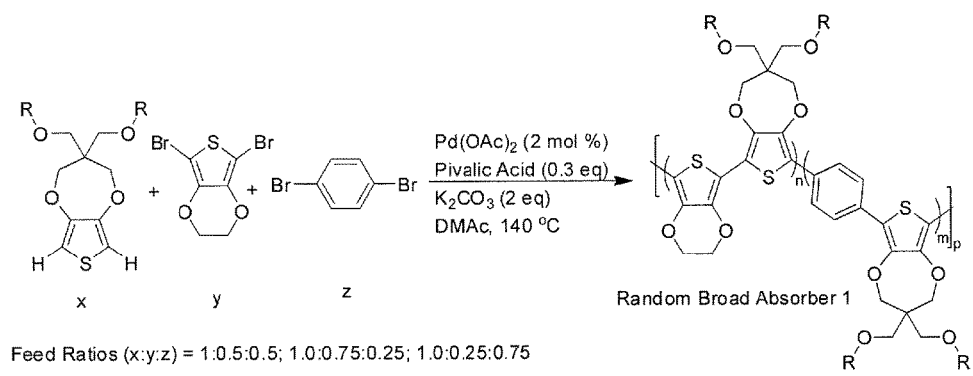

Direct arylation can be employed for the formation of random copolymers, where the monomers ProDOT, EDOT, and phenylene with various monomer feed ratios can be used to prepare terpolymers. According to an embodiment of the invention, the terpolymers can be those that do not have any dyads of the same repeating unit. By varying the feed ratios of phenylene to EDOT, one can attain drastically varying colors for copolymers and terpolymers, as shown below, which can switch to various colored states as indicated in FIG. 7, where ECP-yellow, the alternating copolymer of ProDOT and phenylene, is included.

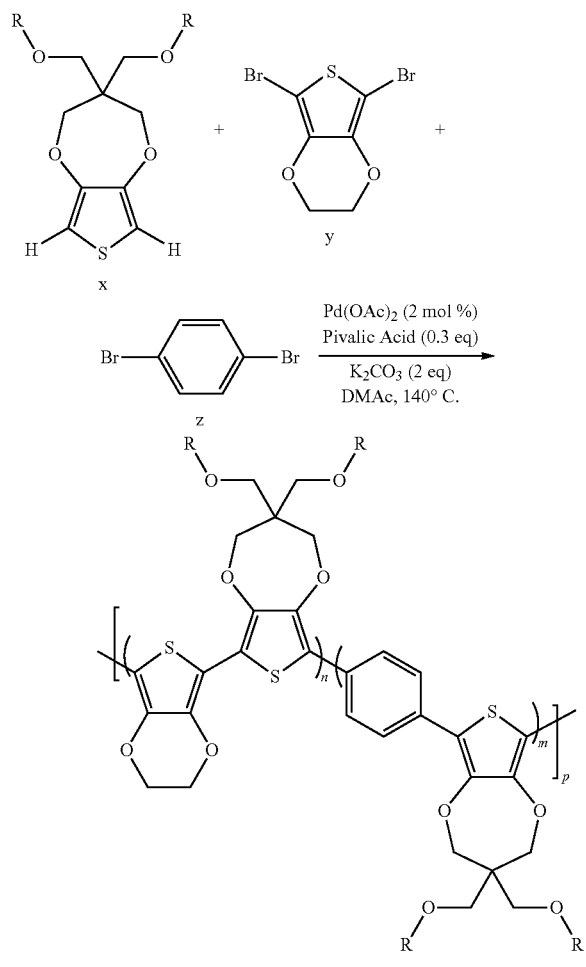

Random Broad Absorber 1
Feed Ratios (x:y:z) = 1:0.5:0.5; 1.0:0.75:0.25; 1.0:0.25:0.75

Figure 8:
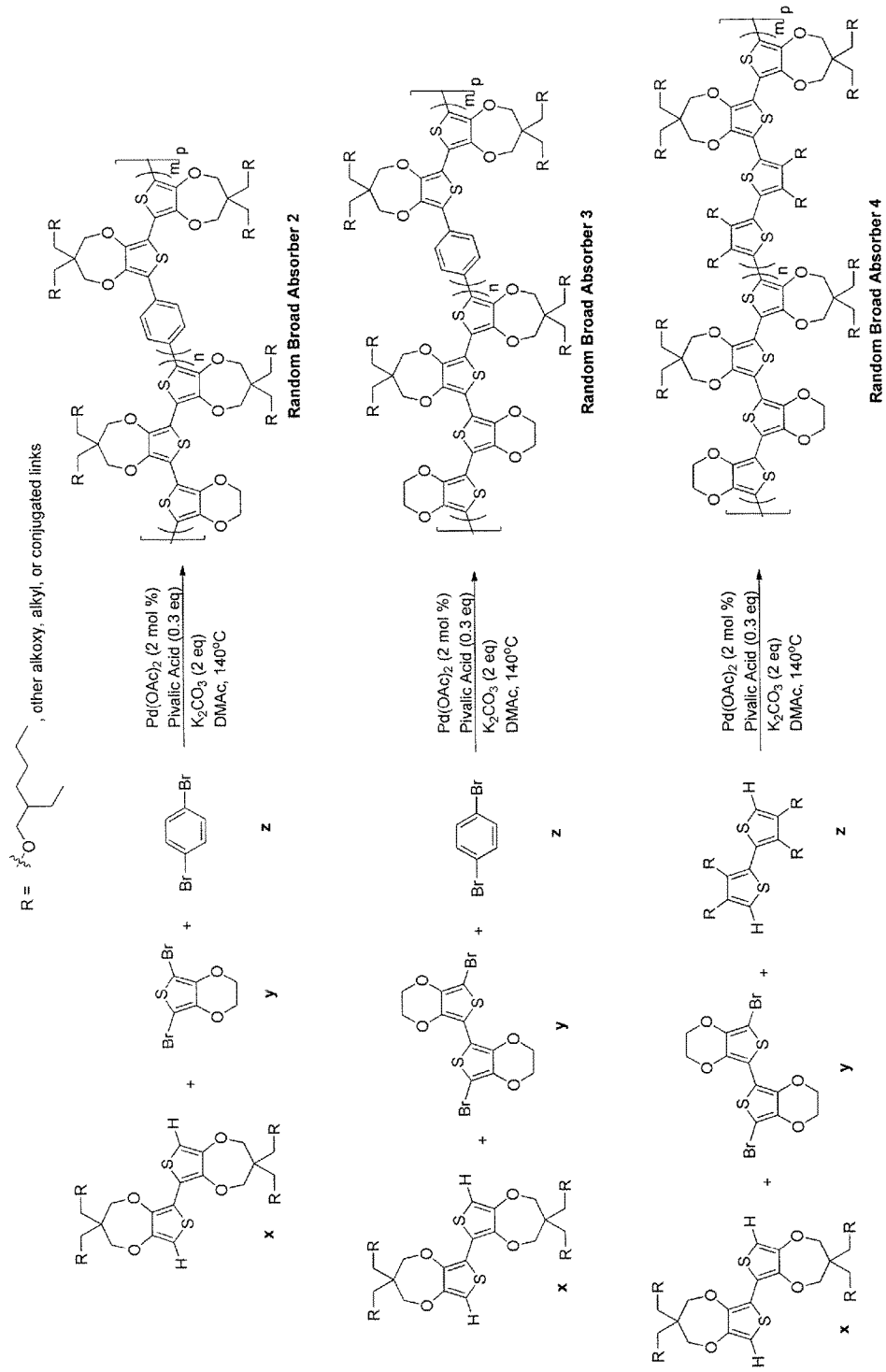
FIG. 8 shows reaction schemes for the direct arylation method for synthesizing ECPs, according to an embodiment of the invention, that have random placements with isolated dioxythiophene dyads within the copolymer (terpolymer).

In an embodiment of the invention, a regular or random copolymer can be prepared where a repeating unit is within the copolymer as dyads of the copolymer and are never present as the single repeating unit. This is illustrated in FIG. 8 where three copolymers are terpolymers having: one repeating unit of the three that is present only as dyads with the other two repeating units being present only as isolated monads; two repeating units of the three that are present only as dyads with the other repeating unit being present as isolated monads; and all three repeating units present only as dyads. As illustrated for the polymerization of dimeric oligomers that function as monomers with respect to the polymerization process of $ProDOT_2$, $EDOT_2$, or $thiophene_2$ in FIG. 8, the dimeric oligomers that function as a monomer toward the polymerization process can be $AcDOT_2$ or other non-acceptor dimers that lead to isolated dyads of the resulting copolymer.

Figure 9:
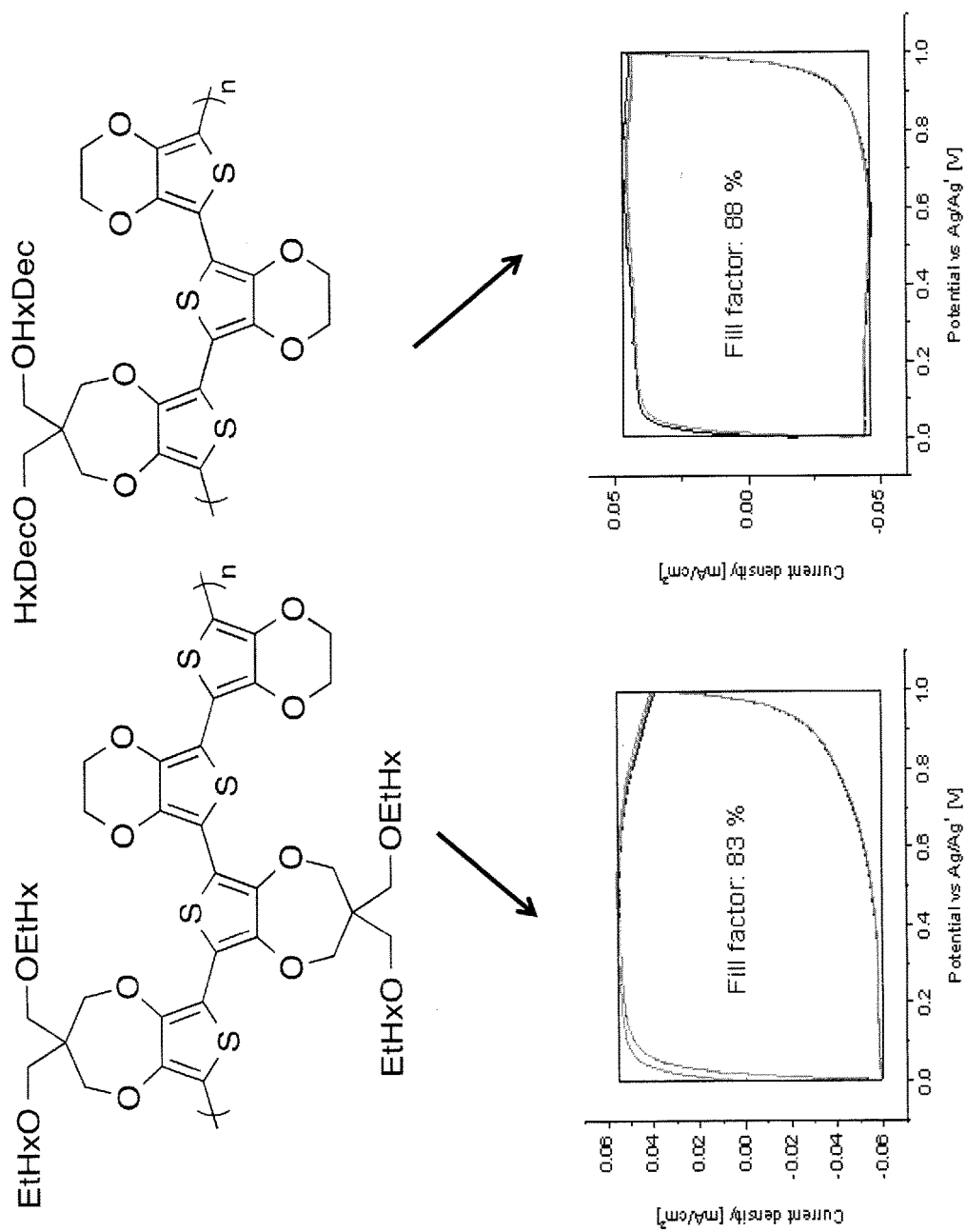
FIG. 9 shows current density plots over the potential range for switching of ECPS according to an embodiment of the invention, where EDOT dyads provide high fill factors for soluble copolymers that can be used in supercapacitors.
Figure 10A:
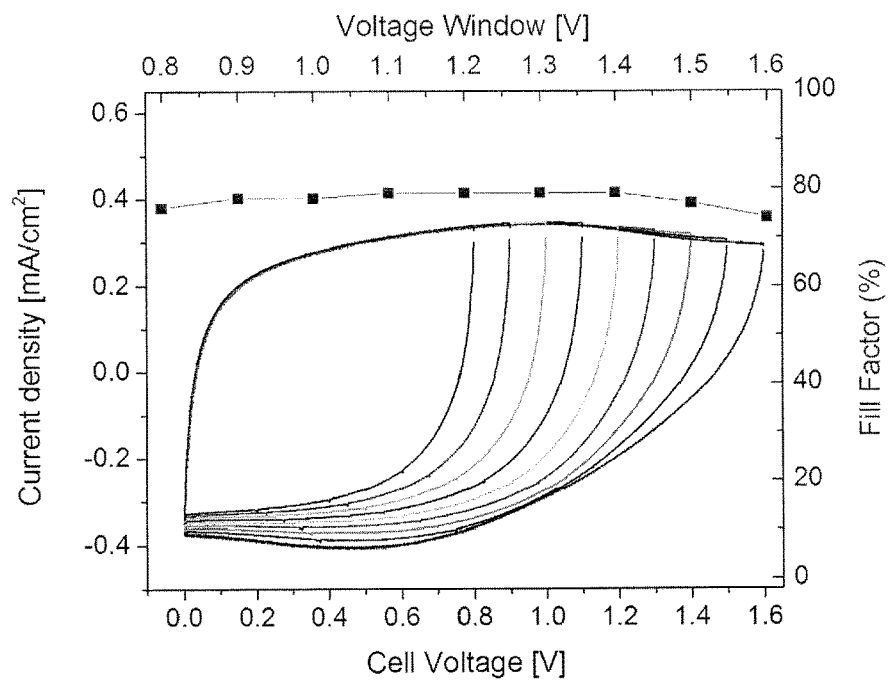
FIG. 10a and FIG. 10b show voltage window plots for ProDOT-EDOT$_2$ and ProDOT$_2$-EDOT$_2$, respectively, according to an embodiment of the invention, with plots of their fill factors over the window for devices employing these copolymers for supercapacitance applications.
Figure 10B:
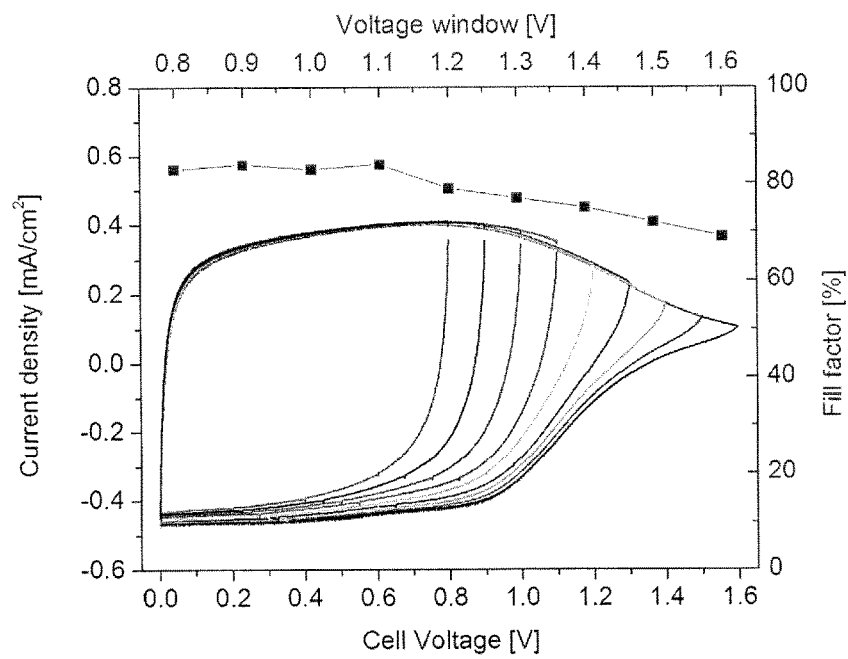
Figure 11A:
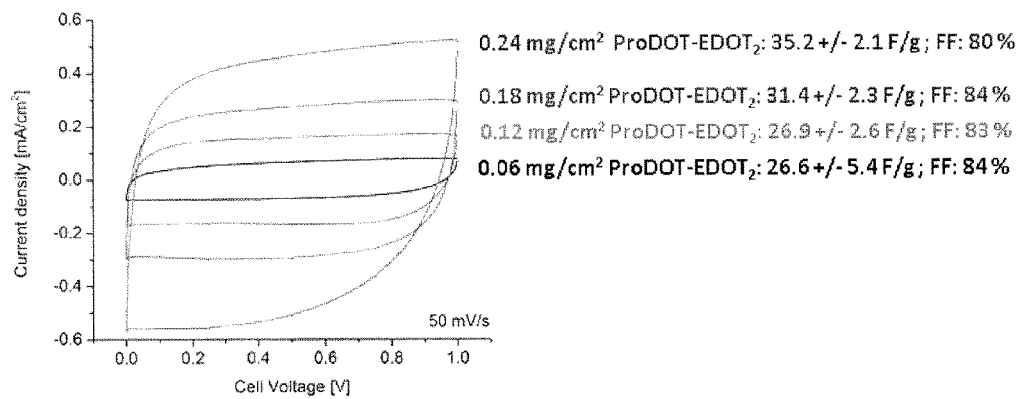
FIG. 11a shows current density plots over the potential range for ProDOT-EDOT$_2$, according to an embodiment of the invention, of different capacitance and thickness prepared by a solution deposition
Figure 11B:
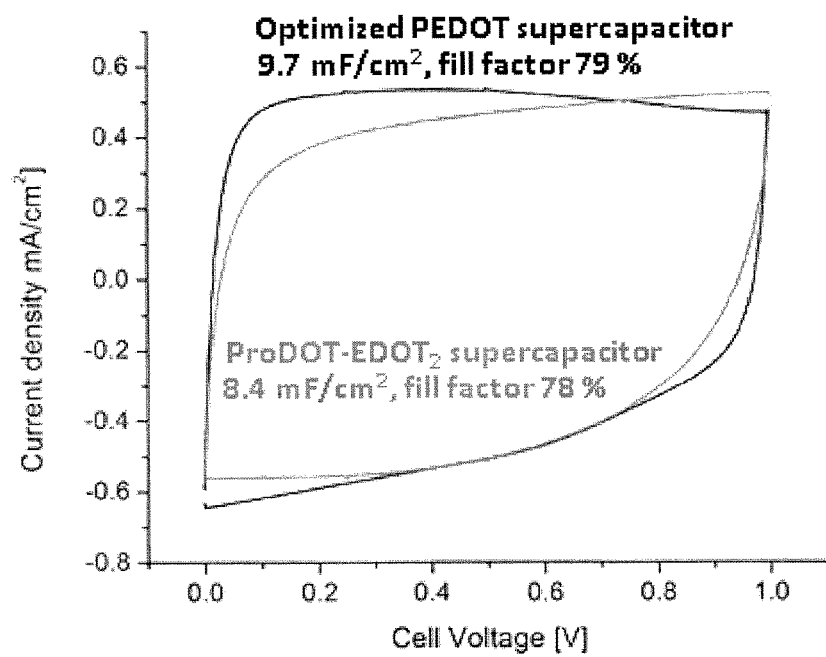
FIG. 11b shows its comparison to a similarly thick PEDOT homopolymers supercapacitor prepared by electropolymerization.

In an embodiment of the invention, the copolymers comprise at least 50% EDOT or PheDOT repeating units and up to 50% ProDOT, where the copolymer has $EDOT_2$ as dyads and is soluble in at least one organic solvent. These materials have a high fill factor (FF), in excess of 80%, as shown in FIG. 9, and permit the fabrication of devices that can be charged/discharged in >1.0 V window up to a 1.6 V widow without compromising the fill factor, as shown in FIG. 10, and have switching speeds of less than one second. The switching speed for an exemplary $ProDOT_2$-$EDOT_2$ is 0.53 seconds where the specific capacitance is $5.6\pm0.35$ $mF/cm^2$ and a capacitance of $31.5\pm2.0$ F/g was observed and a switching speed of 0.51 seconds for an exemplary ProDOT-$EDOT_2$ with a specific capacitance of $6.5\pm0.35$ $mF/cm^2$ and capacitance of $36.1\pm3.9$ F/g. As shown in FIG. 11, the solution deposited ProDOT-$EDOT_2$ copolymer displays a fill factor as a supercapacitor that is nearly identical to that of EDOT homopolymers deposited by electrochemical polymerization.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An acceptor free dioxythiophene comprising electrochromic polymer (ECP), comprising:
at least one copolymer block having a multiplicity of repeating units, wherein the copolymer consists of repeating units with at least one dioxythiophene repeating unit residing exclusively as isolated dyads, triads, or both within the copolymer, the copolymer is an alternating copolymer of a repeating unit comprising a propylenedioxythiophene (ProDOT) and a repeating unit comprising an acyclic dioxythiophene (AcDOT), a phenylene dioxythiophene (PheDOT) or an ethylene dioxythiophene (EDOT), or the copolymer is an alternating copolymer of a repeating unit comprising an acyclic dioxythiophene (AcDOT) and a repeating unit comprising a phenylene dioxythiophene (PheDOT);
optionally, further consisting of at least one non-dioxythiophene repeating unit selected from arylenes, thiophenes, furans, pyrroles, selenothiophenes, N-substituted pyrroles, acyclic dioxyfurans, acyclic dioxypyrroles, propylenedioxyfurans, propylenedioxypyrroles, N-substituted propylenedioxypyrroles, phenylene dioxypyrroles, N-substituted phenylene dioxypyrroles, ethylenedioxyfurans, acyclic dioxyselenophenes, ethylenedioxyselenophenes, phenylene dioxyselenophenes, propylenedioxyselenophenes, ethylenedioxpyrroles, and N-substituted ethylenedioxpyrroles placed either regularly or randomly within the dioxythiophene repeating units other than within the isolated dyads;

wherein at least one of the dioxythiophene repeating units has an alkyl comprising substituent and is present in at least five percent to provide solubility of the electrochromic polymer in an organic solvent; and wherein no acceptor repeating units are included in the copolymer block.

2. The acceptor free dioxythiophene comprising electrochromic polymer (ECP) according to claim 1, wherein the dioxythiophene repeating unit residing exclusively as isolated dyads or triads are ethylenedioxythiophene ($EDOT_2$) or ($EDOT_3$).

3. The acceptor free dioxythiophene comprising electrochromic polymer (ECP) according to claim 2, wherein the ethylenedioxythiophene ($EDOT_2$) or ($EDOT_3$) is unsubstituted.

4. A supercapacitor, comprising an acceptor free dioxythiophene comprising electrochromic polymer (ECP) according to claim 3, wherein the ECP is a single block, and wherein EDOT or PheDOT repeating units are at least 50% of all repeating units of the ECP.

5. The acceptor free dioxythiophene comprising electrochromic polymer (ECP) according to claim 1, wherein the dioxythiophene repeating unit residing exclusively as isolated dyads is propylenedioxythiophene ($ProDOT_2$).

6. The acceptor free dioxythiophene comprising electrochromic polymer (ECP) according to claim 1, wherein the dioxythiophene repeating unit residing exclusively as isolated dyads is substituted dioxythiophene ($AcDOT_2$).

7. The acceptor free dioxythiophene comprising electrochromic polymer (ECP) according to claim 1, wherein the copolymer is: $AcDOT_2$-$EDOT_2$; AcDOT-ProDOT; $AcDOT_2$-ProDOT; $AcDOT_2$-$EDOT_2$; $ProDOT_2$-EDOT; ProDOT-EDOT; or $ProDOT_2$-$EDOT_2$.

8. The acceptor free dioxythiophene comprising electrochromic polymer (ECP) according to claim 1, wherein the copolymer is: AcDOT-$EDOT_3$; ProDOT-$EDOT_3$; $AcDOT_2$-$EDOT_3$; or $ProDOT_2$-$EDOT_3$.

9. The acceptor free dioxythiophene comprising electrochromic polymer (ECP) according to claim 1, wherein the alkyl substituent is a $C_3$ to $C_{20}$ alkyl.

10. An electrochromic device, comprising at least one acceptor free dioxythiophene comprising electrochromic polymer (ECP) according to claim 1.

* * * * *